United States Patent
Koo

(10) Patent No.: US 6,958,913 B2
(45) Date of Patent: Oct. 25, 2005

(54) HEATSINK MOUNTING UNIT

(75) Inventor: Kyung-ha Koo, Suwon (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 201 days.

(21) Appl. No.: 10/298,615

(22) Filed: Nov. 19, 2002

(65) Prior Publication Data
US 2003/0235037 A1 Dec. 25, 2003

(30) Foreign Application Priority Data
Jun. 20, 2002 (KR) ................. 2002-34631

(51) Int. Cl.[7] .............................................. H05K 7/20
(52) U.S. Cl. ..................... 361/704; 24/457; 24/458; 248/510; 165/80.3; 165/185; 174/16.3; 257/719; 361/710; 361/719; 361/720
(58) Field of Search .................. 24/457–458; 248/565, 248/510; 165/80.2, 80.3, 185; 174/18.3; 257/706–707, 257/712–713, 718–719, 726–727; 361/687, 361/704–710, 719–720

(56) References Cited

U.S. PATENT DOCUMENTS

| 5,541,811 A | * | 7/1996 | Henningsson et al. | ...... 361/704 |
| 5,570,271 A | | 10/1996 | Lavochkin | |
| 5,640,305 A | * | 6/1997 | Smithers | ...... 361/719 |
| 5,734,556 A | * | 3/1998 | Saneinejad et al. | ...... 361/719 |
| 6,222,734 B1 | * | 4/2001 | Bookhardt et al. | ...... 361/719 |
| 6,353,537 B2 | * | 3/2002 | Egawa | ...... 361/704 |
| 6,492,202 B1 | * | 12/2002 | Lober et al. | ...... 438/122 |

FOREIGN PATENT DOCUMENTS

| JP | 7-66573 | 3/1995 |
| JP | 9-258849 | 10/1997 |
| JP | 9-325831 | 12/1997 |
| JP | 10-275968 | 10/1998 |
| KR | 1998-35114 | 9/1998 |
| KR | 1999-34591 | 5/1999 |
| KR | 1999-29778 | 7/1999 |
| KR | 2001-7146 | 1/2001 |
| KR | 2001-26307 | 4/2001 |
| KR | 20-235072 | 6/2001 |
| KR | 2001-91330 | 10/2001 |

* cited by examiner

Primary Examiner—Gregory Thompson
(74) Attorney, Agent, or Firm—Staas & Halsey LLP

(57) ABSTRACT

A heatsink mounting unit prevents a heatsink cooling an electronic device mounted on a printed circuit board from a breakaway. The heatsink mounting unit includes a flat spring having a first end part formed with a combining arm combined to the printed circuit board by a fastening device and a second end part having a hook. The flat spring elastically presses the heatsink against the printed circuit board. The heatsink mounting unit also includes a hook holding member combined to the printed circuit board and having a hook hole to which the hook is hooked. Thus, the present invention provides a heatsink mounting unit which is easily mounted and effectively prevents a heatsink from a breakaway.

10 Claims, 3 Drawing Sheets

HEATSINK MOUNTING UNIT

CROSS-REFERENCE TO RELATED APPLICATION

This application claims the benefit of Korean Application No. 2002-34631, filed Jun. 20, 2002, in the Korean Intellectual Property Office, the disclosure of which is incorporated herein by reference.

BACKGROUND OF THE INVENTION

1. Field of the Invention

The present invention relates to a heatsink mounting unit, and more particularly, to a heatsink mounting unit which is easily mounted and effectively prevents a heatsink from a breakaway.

2. Description of the Related Art

Generally, electric appliances are provided with printed circuit boards. The printed circuit boards are mounted with electronic devices such as semiconductors, etc. Some of the electronic devices generate heat when operated over a long period of time. If these electronic devices are overheated, problems occur with the electric appliances. Therefore, a heatsink is required to cool the electronic devices mounted on the printed circuit boards.

As an example, a heatsink to cool the electronic devices is provided in a computer system. In the computer system, the heatsink is used to cool a CPU (central processing unit) mounted to a main board.

FIG. 1 illustrates a state in which a heatsink is mounted to a main board by a conventional heatsink mounting unit. As shown in FIG. 1, the conventional heatsink mounting unit includes a flat spring 120 pressing a heatsink 112 against a main board 110, and four bolts 114 fastening the flat spring 120 to the main board 110. The flat spring 120 is formed with combining arms 122 having bolt through holes 122a through which the bolts 114 are passed. The main board 110 is formed with bolt combining holes (not shown) to which the bolts 114 are fastened through the bolt through holes 122a of the flat spring 120. The combining arms 122 form two pairs spaced from each other so as to combine the flat spring 120 to the main board 110 firmly. The bolt combining holes (not shown) of the main board 110 are disposed in correspondence to the bolt through holes 122a of the flat spring 120.

However, with the conventional heatsink mounting unit, a user has to match up the bolt combining holes (not shown) of the main board 110 and the bolt through holes 122a of the flat spring 120 before combining the flat spring 120 to the main board 110 with the four bolts 114. Further, the user has to fasten the bolts 114 to the bolt combining holes (not shown) such that a predetermined bolt fastening is performed so as to lessen thermal contact resistance.

SUMMARY OF THE INVENTION

Accordingly, it is an object of the present invention to provide a heatsink mounting unit which is easily mounted and effectively prevents a heatsink from a breakaway.

Additional objects and advantages of the invention will be set forth in part in the description which follows and, in part, will be obvious from the description, or may be learned by practice of the invention.

The foregoing and other objects of the present invention are achieved by providing a heatsink mounting unit to prevent a heatsink cooling an electronic device mounted on a printed circuit board from a breakaway. The heatsink mounting unit includes a flat spring having a first end part formed with a combining arm combined to the printed circuit board by a fastening device and a second end part having a hook. The flat spring elastically presses the heatsink against the printed circuit board. The heatsink mounting unit also includes a hook holding member combined to the printed circuit board, and having a hook hole to which a hook is hooked.

According to an aspect of the invention, at least one pair of combining arms is spaced from each other, and the fastening device includes a screw.

According to an aspect of the invention, the hook has a bent part which is bent at an end part of the hook.

BRIEF DESCRIPTION OF THE DRAWINGS

The above and other objects and advantages of the present invention will become apparent and more readily appreciated from the following description of the preferred embodiment, taken in conjunction with the accompany drawings of which.

DETAILED DESCRIPTION OF THE PREFERRED EMBODIMENT

Figure 1:
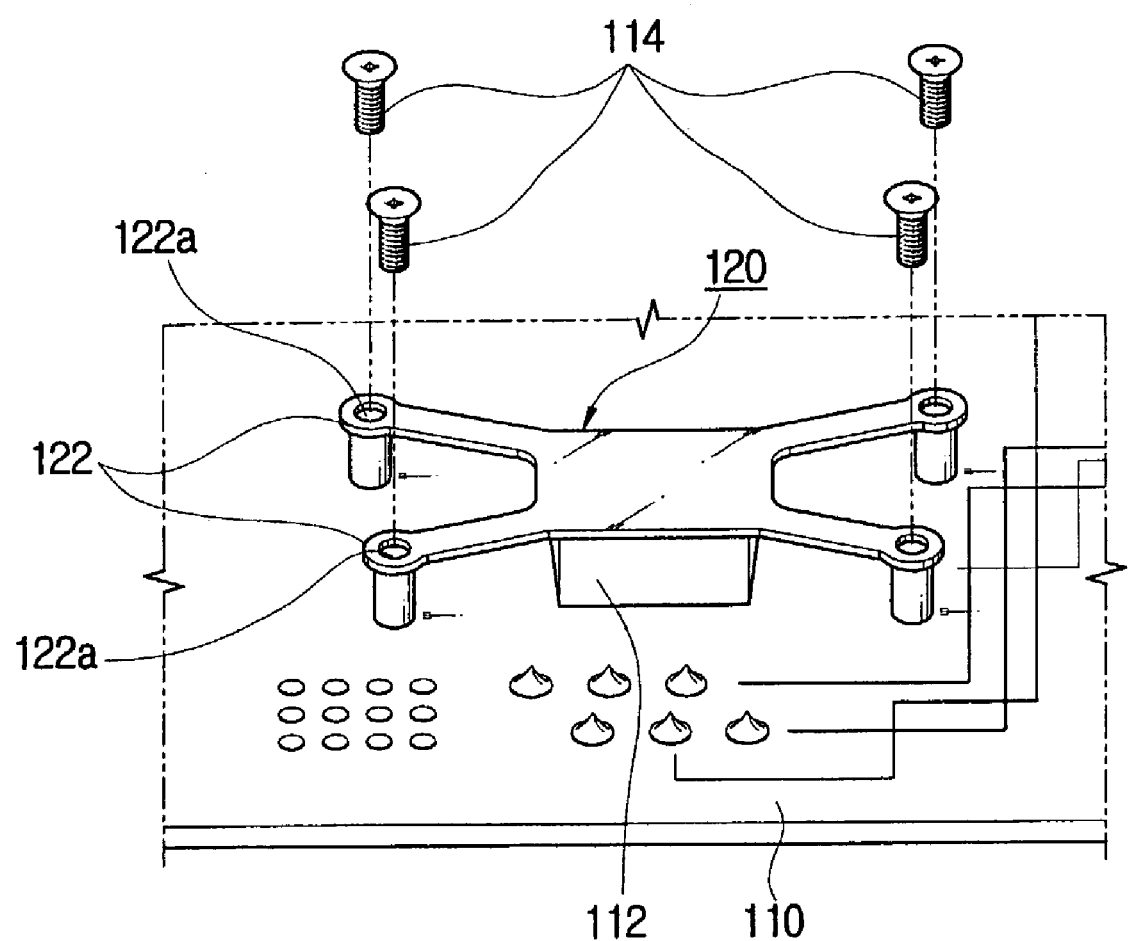
FIG. 1 illustrates a conventional heatsink mounting unit.

Reference will now be made in detail to the present preferred embodiments of the present invention, examples of which are illustrated in the accompanying drawings, wherein like reference numerals refer to like elements throughout.

Figure 2:
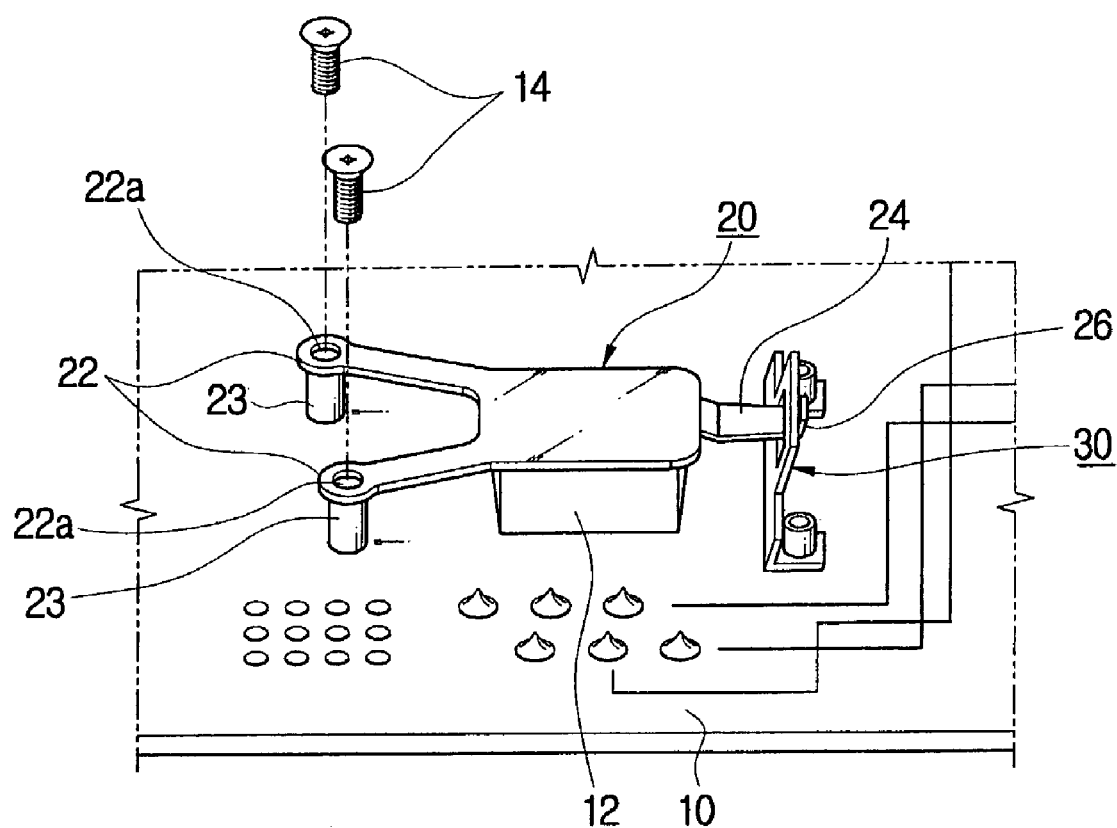
FIG. 2 illustrates a heatsink mounting unit, according to an embodiment of the present invention.
Figure 3:
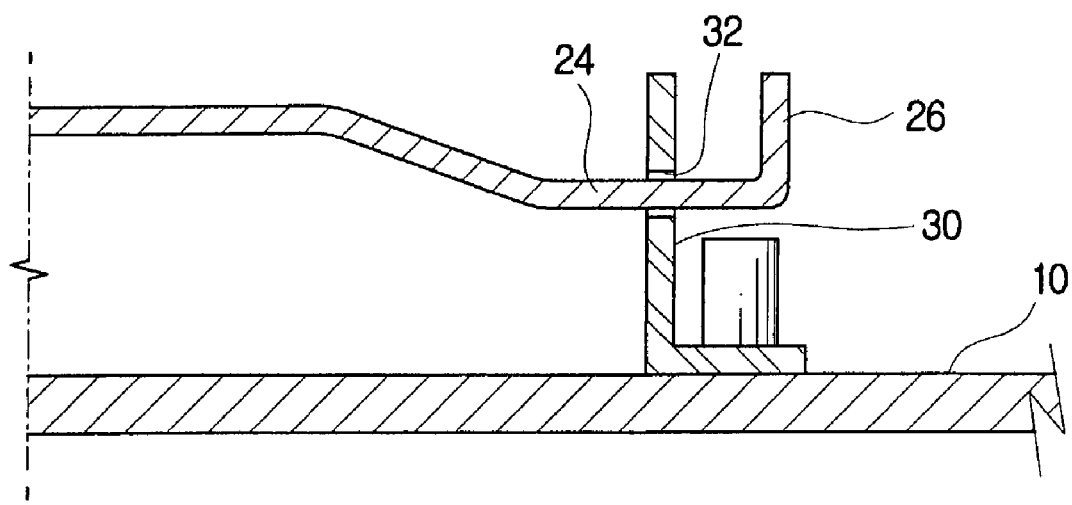
FIG. 3 is a side-sectional view of a hook holding member and a hook part of the heatsink mounting unit shown in FIG. 2.

FIG. 2 illustrates a heatsink mounting unit, according to an embodiment of the present invention, and FIG. 3 is a side-sectional view of a hook holding member and a hook part of the heatsink mounting unit shown in FIG. 2. As shown in FIGS. 2 and 3, the heatsink mounting unit includes a flat spring 20 to elastically press a heatsink 12 against a main board 10, and having a pair of combining arms 22 and a hook 24. The heatsink mounting unit also includes a hook holding member 30 combined to the main board 10 and having a hook hole 32 to which the hook 24 is hooked.

The main board 10 is mounted with a CPU (not shown). The heatsink 12 is placed on the CPU and emits heat generated by the CPU. The flat spring 20 includes a main plate being in contact with an upper part of the heatsink 12 and elastically presses the heatsink 12 against the main board 10. The flat spring 20 also includes a first end part having the pair of combining arms 22 extended from the main plate and each of the pair of combining arms 22 has a cylindrical boss part 23 at the end thereof. The flat spring 20 has a second end part including the hook 24 which has a bent part 26 upwardly bent and hooked to the hook hole 32 of the hook holding member 30 (to be described later).

Herein, each cylindrical boss part 23 of the combining arm 22 is formed with a bolt through hole 22a through which a bolt 14 is passed. Further, the main board 10 is formed with bolt combining holes (not shown) in correspondence to the bolt through holes 22a of the cylindrical boss part 23 and the combining arms 22 of the flat spring 20. Thus, the bolt 14 passes through the bolt through hole 22a of the combining arms 22 of the flat spring 20, and is then fastened to the bolt combining hole (not shown) of the main board 10. The combining arms 22 form one pair spaced from each other so as to combine the flat spring 20 to the main board 10 firmly. The cylindrical boss part 23 is configured with a height to make the flat spring 20 press the heatsink 12 effectively.

The hook holding member 30 is combined to the main board 10, and includes the hook hole 32 to which the hook 24 provided at the second end part of the flat spring 20 and having the bent part 26 is hooked (see FIG. 3). Herein, the hook holding member 30 may be combined to the main board 10 by glue, a rivet, or a screw. When using the screw, a screw hole on the main board 10 is required.

A process of mounting the heatsink 12 to the main board 10 with the heatsink mounting unit according to the present invention is described below.

First, the hook 24 provided at the second end part of the flat spring 20 and having the bent part 26 is hooked to the hook holding member 30 combined to the main board 10, with the flat spring 20 being placed on the heatsink 12. Then, since the flat spring 20 does not move laterally because of the hook holding member 30, positions of the bolt through holes 22a of the cylindrical boss parts 23 and the combining arms 22 of the flat spring 20 are automatically aligned to positions of the bolt combining holes (not shown) formed on the main board 10 through the bolt through holes 22a of the combining arms 22 of the flat spring 20. Then, the bolts 14 are fastened to the bolt combining holes (not shown) of the main board 10, without manually aligning the bolt through holes 22a and the bolt combining holes, respectively.

Herein, the pair of combining arms 22 provided at the first end part of the flat spring 20 and the hook 24 provided at the second end part form an approximately triangular structure, so that the flat spring 20 mounts the heatsink 12 to the main board 10 stably. Further, because the bolts 14 are engaged with only the first end part of the flat spring 20, the number of the bolts 14 used is decreased in comparison with that of the conventional heatsink mounting unit. Also, there is no need to consider the order of fastening the bolts 14 to the bolt combining holes, with regard to thermal contact resistance.

In the foregoing description, the flat spring 20 is combined to the main board 10 by the bolts 14. However, the flat spring 20 may be combined to the main board 10 by a pin, a snap ring, a rivet, etc.

Also, in the foregoing description, the hook 24 provided at the second end part of the flat spring 20 has the bent part 26 which is upwardly bent. However, the bent part 26 of the hook 24 may be bent downwardly.

In the foregoing description, the pair of combining arms 22 is provided at the first end of the flat spring 20. However, more than one pair of combining arms may be provided at the first end of the flat spring 20.

Therefore, as described above, the heatsink mounting unit according to the present invention includes the flat spring which has the first end part having the combining arms combined to the printed circuit board by the fastening device and the second end part having the hook. Also, the flat spring elastically presses the heatsink against the printed circuit board. The heatsink mounting unit also includes the hook holding member combined to the printed circuit board and having the hook hole to which the hook is hooked. Thus, the heatsink mounting unit effectively prevents a heatsink from a breakaway and is easily operated.

Although a preferred embodiment of the present invention has been shown and described, it will be appreciated by those skilled in the art that changes may be made in these embodiments without departing from the principles and spirit of the invention, the scope of which is defined in the claims and their equivalents.

What is claimed is:

1. A heatsink mounting unit to prevent a heatsink cooling an electronic device mounted on a printed circuit board from a breakaway, comprising:
   a flat spring including a first end part formed with at least one pair of combining arms combined to the printed circuit board by a fastening device and a second end part having a hook, the flat spring elastically pressing the heatsink against the printed circuit board;
   a hook holding member combined to the printed circuit board and having a hook hole to which the hook is hooked.

2. The heatsink mounting unit according to claim 1, wherein the at least one pair of combining arms provided at the first end part of the flat spring are spaced from each other.

3. A heatsink mounting unit to prevent a heatsink cooling an electronic device mounted on a printed circuit board from a breakaway, comprising:
   a flat spring including a first end part formed with a combining arm combined to the printed circuit board by a screw and a second end part having a hook, the flat spring elastically pressing the heatsink against the printed circuit board; and
   a hook holding member combined to the printed circuit board and having a hook hole to which the hook is hooked.

4. The heatsink mounting unit according to claim 1, wherein the hook has a bent part which is bent at an end part of the hook.

5. A heatsink mounting unit to prevent a heatsink cooling an electronic device mounted on a printed circuit board from a breakaway, comprising:
   a flat spring including a first end part formed with a combining arm combined to the printed circuit board by a fastening device and a second end part having a hook, the flat spring elastically pressing the heatsink against the printed circuit board; and
   a hook holding member combined to the printed circuit board and having a hook hole to which the hook is hooked,
   wherein the pair of combining arms comprises a cylindrical boss part at an end of the combining arms.

6. The heatsink mounting unit according to claim 5, wherein the cylindrical boss part and each of the combining arms are formed with a through hole, and the printed circuit board is formed with combining holes in correspondence with the through holes of the cylindrical boss part and the combining arms, so that the fastening device passes through the through holes to fasten to the combining holes on the printed circuit board.

7. The heatsink mounting unit according to claim 5, wherein the cylindrical boss part is configured at a height to allow the flat spring to press the heatsink against the printed circuit board.

8. The heatsink mounting unit according to claim 6, wherein positions of the bolt through holes of the cylindrical boss part and the combining arms are automatically aligned to positions of the bolt combining holes on the printed board when the hook is hooked in the hook hole.

9. The heatsink mounting unit according to claim 2, wherein the combining arms provided at the first end part of the flat spring and the hook provided at the second end part form a triangular structure, so that the flat spring mounts the heatsink to the printed circuit board in a stable position.

10. The heatsink mounting unit according to claim 1, wherein the hook has a bentpart which is bent upwardly at an end part of the hook.

* * * * *